United States Patent
Tokushima et al.

[11] Patent Number: 5,866,020
[45] Date of Patent: Feb. 2, 1999

[54] METHOD OF MANUFACTURING TAB TAPES AND LAMINATED BODY FOR PRODUCING THE SAME

[75] Inventors: Junji Tokushima, Shimonoseki; Hiroshi Iguchi, Simonoseki; Tatsuo Kataoka, Kawaguchi, all of Japan

[73] Assignee: Mitsui Mining & Smelting Co., Ltd., Japan

[21] Appl. No.: 708,939

[22] Filed: Sep. 6, 1996

[30] Foreign Application Priority Data

Oct. 30, 1995 [JP] Japan ..................................... 7-303377
Feb. 20, 1996 [JP] Japan ..................................... 8-055403

[51] Int. Cl.$^6$ .................................................. H01L 21/58
[52] U.S. Cl. ................................. 216/17; 216/20; 216/49
[58] Field of Search .................................. 216/17, 20, 49

[56] References Cited

U.S. PATENT DOCUMENTS 5,290,614 3/1994 Narushima et al. ....................... 428/40
5,587,341 12/1996 Masayuki et al. ....................... 437/206

Primary Examiner—Mark Chapman
Attorney, Agent, or Firm—Morrison Law Firm

[57] ABSTRACT

A method of manufacturing TAB tapes comprising the steps of (1) to (5):

(1) laminating a protection film-covered adhesive layer on the entire surface of at least one face of a base film except both the edge portions thereof thereby to obtain a laminated portion, the base film being enough wide to provide a base film for each of the intended plural TAB tapes each having a desired width;

(2) drilling sprocket holes in the thus obtained laminated portion comprising the base film and the protection film-covered adhesive layer and in both the edge portions of said base film and drilling device holes in said laminated portion;

(3) peeling said protection film off the adhesive layer, and adhering a copper foil to said adhesive layer;

(4) applying a photoresist to said copper foil, exposing and developing the photoresist-applied copper foil and then etching the photoresist-developed copper foil to form wiring patterns thereby to obtain a wide TAB tape in which plural strips of TAB tape having the disired width are originally connected to each other in parallel; and then (5) slitting said wide TAB tape in the longitudinal direction thereof to obtain plural separate strips of TAB tape having the desired width.

8 Claims, 3 Drawing Sheets

METHOD OF MANUFACTURING TAB TAPES AND LAMINATED BODY FOR PRODUCING THE SAME

BACKGROUND OF THE INVENTION

1. Field of the Invention

The present invention relates to a method of manufacturing TAB (tape automated bonding) tapes and to a laminated body for use in manufacturing the TAB tapes, and more particularly it relates to such a method which can be carried out at a low cost and efficiently and also allows existing conventional equipments for producing one strip of TAB tape to be used for manufacturing plural separate strips of desired TAB tape at the same time, by providing an adhesive layer and a copper foil over the entire surface of a base film except both the edge portions thereof, the base film having such a width that two or more TAB tapes having a desired width are obtainable, and also relates to such a laminated body for manufacturing therefrom TAB tapes, which is an intermediate product obtained in the course of manufacture of the TAB tapes.

2. Prior Art

In a case where TAB tapes having a width of, for instance, 35 mm are attempted to be manufactured, they will generally be manufactured from a base film having a width of 70 mm and other necessary materials to obtain a wide TAB tape and then slitting the thus-obtained wide TAB tape in the longitudinal direction into two equal parts thus obtaining two separate strips of 35 mm-wide TAB tape. This is a so-called method for manufacturing a binary TAB tape.

FIG. 2 shows an example of a conventional method for manufacturing two separate strips of TAB tape at the same time by using said so-called method. FIG. 2 is a schematic cross sectional view showing the steps which are comprised in the conventional method.

In the Figure, reference numeral 1 is a base film which is wide, 2 an adhesive layer, 3 a protection film, 4 a sprocket hole, 5 a copper foil, 6 a photoresist, 7 a wide (twice the width of a desired tape) TAB tape and 8 a desired TAB tape.

In FIG. 2, the adhesive layer 2 having the protection film 3 provided thereon is laminated on the base film 1 as a substrate (FIG. 2(b)), and holes such as sprocket holes 4, 4' and device holes 9 are then drilled in the central portion as well as in both the edge portions 10, 10 of the base film 1 (FIG. 2(c) and FIG. 4). After the protection film 3 is peeled off the adhesive layer 2, the copper foil 5 is adhered to the adhesive layer 2 (FIG. 2(d)). The photoresist 6 is applied to this copper foil 5, exposed and then developed thereon (FIG. 2(e)), after which a backing agent is applied to the reverse surface of the base film 1 (not shown herein) and then the photoresist-developed copper foil 5 is etched to form wiring patterns (FIG. 2(f)). The thus manufactured wide TAB tape 7 for producing therefrom two separate strips of TAB tape at the same time, the wide TAB tape consisting of two strips of TAB tape originally connected to each other in parallel, is slit (divided) into two parts at the center in the longitudinal direction of the wide TAB tape thereby to obtain two separate strips of TAB tape 8 (FIG. 2(g)).

It should be noted that, generally prior to or after the step of slitting as described above, a solderresist ink is screen-printed on the wiring patterns and cured, after which the solderresist-cured wiring patterns are subjected to plating. In this case, it is optional whether or not the solderresist is printed on the wiring patterns before the plating.

In a conventional method for producing two separate strips of TAB tape at the same time as described above, as shown in FIGS. 2(a) to (d) and particularly FIG. 4, two strips of the protection film-covered adhesive layer or two strips of the copper foil are laminated on or adhered respectively to spaces 2', 2' (hatched portions) located at the right and left side portions of the regions between the sprocket holes 4 and 4' by using 2 roll-out devices for the lamination or adhesion set up respectively at said right and left side portions. Namely the lamination or adhesion is separately executed at the right and left side portions of the base film. For this reason, such 2 roll-out devices for lamination or adhesion are required, and the devices have to be controlled separately at the right and left side portions of the base film, thus causing the setting of the devices to be complicated. Further, because the 2 devices are utilized, there will often occur positional displacements of the adhesive layers or copper foils at both the side portions on the base film, respectively, whereby it is very often difficult to slit the resulting wide TAB tape into two separate TAB tapes. It should be noted that, FIG. 4 is a plan view showing areas on which the adhesive layers are separately laminated in the conventional method for manufacturing two separate strips of TAB tape at the same time, and in the figure, reference numeral 2' designates an area on which the adhesive layer is to be laminated, and 9 a device hole.

Before forming wiring patterns by etching the copper foils, a backing agent as an etching resist is applied to the reverse surface of the base film (the reverse side of the base film surface to which the copper foil is adhered) at each of the right and left side portions of the reverse just below the copper foil, but in this case, the backing agent trickles to the surface (to which the copper foil is adhered) on which wiring patterns are to be formed, through the sprocket holes in the central portion of the film, thereby to cause a short of the wiring.

Further, in the conventional method for producing two separate strips of TAB tape at the same time, the central portion of the base film on which the adhesive layer and copper foil are not laminated is naturally thinner than other portions thereof, and for this reason it is required that a conventional production line for producing two separate strips of TAB tape at the same time is necessarily provided with rollers to support the central portion of a base film upward so that the central portion does not sag.

On the other hand, in a case where one strip of TAB tape is produced from one base film and other necessary materials, namely, in case of so-called one-strip production, it is not necessary to support upward the central portion of the base film on which an adhesive layer and a copper foil are laminated since the central portion of the laminated base film is identical in thickness with its surrounding portions. In cases where there should be provided such rollers as to support the central portion, no problem will be raised when the laminated film is passed with its wiring pattern being faced upward, whereas inconveniences will be incurred since such rollers constitute an obstacle or bar to the wire pattern when the laminated film is passed with its wiring pattern being faced downward (The same is applicable to a case where the laminated film has wiring pattern respectively on both the faces thereof.). Thus, such rollers as to support upward the central portion are usually not provided on the one-strip producing line except the place where the laminated base film is passed with its wiring pattern being faced upward.

Accordingly, there have heretofore been needed separately an exclusive two-strip producing line requiring rollers to support the central portion of the laminated film and an exclusive one-strip producing line requiring no such rollers, this being uneconomical because one producing line cannot be commonly used as said one- and two-strip producing lines. More specifically, even if a 70 mm-wide base film is commonly used in each of the following cases, a conventional line for producing one strip of 70 mm-wide TAB tape is not applicable to production of two separate strips of 35 mm-wide TAB tape at the same time.

Namely, in this manner a conventional method for producing at least two separate strips of TAB tape at the same time is not efficient from the standpoint of equipment and operation employed because of being unable to use equipments for producing one strip of TAB tape.

SUMMARY OF THE INVENTION

This invention was made in view of such circumstances as described above.

An object of this invention is to provide a method for producing plural separate TAB tapes at the same time from one base film on or to which an adhesive layer and the like are laminated or adhered efficiently and without losing dimensional accuracy, the method allowing a conventional existing equipment for producing one strip of TAB tape to be utilized as it is.

Another object of this invention is to provide a laminated body for producing therefrom TAB tapes, which is an intermediate product obtainable at a low cost and has no problem as to its quality such as dimensional accuracy.

The present inventors have solved the aforesaid problems by laminating an adhesive layer, a copper foil and the like on, or adhering them to, the entire area of a base film except both the edge portions thereof.

More particularly, a method for manufacturing TAB tapes according to this invention comprises the following steps of (1) to (5):

(1) laminating a protection film-covered adhesive layer on the entire surface area of at least one face of a base film except both the edge portions thereof, the base film being enough wide to provide a base film for each of the intended plural TAB tapes each having a desired width, (2) drilling sprocket holes and device holes in the base film with the protection film-covered adhesive layer laminated thereon, (3) peeling the protection film off the adhesive layer, and adhering a copper foil to the adhesive layer, (4) applying a photoresist onto the copper foil, thereafter exposing, developing and etching the photoresist-applied copper foil to form wiring patterns thereby to produce a wide TAB tape in which plural strips of TAB tape having the desired width are originally connected to each other in parallel, and then (5) slitting the wide TAB tape in the longitudinal direction thereof to obtain plural separate strips of TAB tape having the desired width.

The width of the base film usable for the wide TAB tape is large enough to provide a base film for each of practically at most six intended slit TAB tapes, preferably 2–3 such TAB tapes, each having a desired width, although it is not particularly limited because it depends on equipments designed.

The present invention will be described hereinafter in more detail with reference to FIGS. 1 and 3. FIG. 1 is a schematic cross sectional view showing steps of manufacturing two separate strips of TAB tape at the same time according to this invention, and FIG. 3 indicates an area (hatched portion) on which an adhesive layer and the like are to be laminated in a method for producing two separate strips of TAB tape according to this invention.

The step (1) in the present invention is a step of laminating a protection film 3-covered adhesive layer 2 on the entire surface area of at least one face of a base film 1 except both the edge portions thereof, the base film 1 having twice the width of the intended TAB tape (FIGS. 1(a) and (b)).

According to this invention, there can be produced at the same time plural separate TAB tapes respectively having optional less widths or different less widths from one single wide base film and other necessary materials. According to the present standards, however, it is preferable in case of producing two separate strips of TAB tape to produce two separate strips of 35 mm-wide or 48 mm-wide TAB tape at the same time respectively from 70 mm-wide or 96 mm-wide base films. Further, in case of producing three separate strips of TAB tape, it is preferable to produce three separate strips of 35 mm-wide TAB tape from a 105 mm-wide base film.

The base film used herein may be a polyimide film, the adhesive used herein an epoxy resin-based adhesive, and the protection film used herein any one of synthetic resin films, but these materials used for the present invention are not particularly limited to those illustrated above.

Both edge portions of a base film are those where an adhesive layer and the like are not laminated, but only sprocket holes are provided. It is preferable that these edge portions be 2.5–4.5 mm in width each.

FIG. 3 shows the area 2" (hatched portion) of a base film which an adhesive layer, a protection film and a copper foil are to be laminated on or adhered to. As shown in FIG. 3, the adhesive layer, etc. are laminated on the entire surface of the base film except both the edge portions 10, 10 thereof.

The step (2) in this invention is a step of drilling sprocket holes 4, 4' and device holes 9 in the base film on which an adhesive layer 2 and a protection film 3 have been laminated (FIG. 1(c) and FIG. 3). A drilling method is not particularly limited and is, for instance, a method of punching with a die.

The thus obtained laminated body (laminated body A) used for producing plural separate TAB tapes (FIG. 1 shows the production of two separate strips of TAB tape) is characteristically such that the protection film 3-covered adhesive layer 2 is laminated on the entire surface of at least one surface of the base film 1 except both the edge portions, the film 1 having twice the desired width of TAB tapes to be produced, thereby to form a laminated portion (comprising the base film 1 excluding both the edge portions thereof + the layer 2+the film 3), and that not only the sprocket holes 4, 4' vertically penetrating the laminated portion and both the edge portions of the base film 1 but also the device holes 9 vertically penetrating the laminated portion are provided in the laminated body.

The step (3) in the present invention is a step for peeling the protection film 3 off the adhesive layer 2, and adhering a copper foil 5 to the adhesive layer 2 (FIG. 1(d)). An electrolytic copper foil, a rolled copper foil or the like is used as the copper foil, and its thickness is preferably 18 $\mu$m, 35 $\mu$m, 70 $\mu$m or the like. There is no specific limitation on a means for adhering a copper foil, and thermal pressure adhesion is illustrated as said means.

The thus obtained laminated body (laminated body B) used for producing plural separate strips of TAB tape (two separate strips thereof in FIG. 1) is characteristically such that the adhesive layer 2 is laminated on the entire surface of at least one surface of the base film 1 except both the edge portions to form a laminated portion (comprising the base film 1 except both the edge portions thereof + the adhesive layer 2), that the copper foil 5 is adhered onto the adhesive layer 2 and that not only the sprocket holes 4, 4' vertically penetrating the laminated portion as well as both the edge portions of the base film 1 but also the device holes 9 vertically penetrating the laminated-portion are provided in the laminated body.

The step (4) in the invention is a step of applying a photoresist 6 onto the copper foil 5, exposing and developing the applied photoresist (FIG. 1(e)), and then etching the photoresist-developed copper foil to form a wiring pattern thereby to obtain a wide TAB tape 7 in which plural (two in FIG. 1) strips of TAB tape are originally connected to each other in parallel or side by side (FIG. 1(f)).

In FIG. 1 when wiring patterns are formed on only one surface of the base film, a backing agent may be applied to the reverse surface of the base film (the other or. the copper foil-free surface of the base film with a copper foil adhered to one surface thereof) before etching the copper foil to form wiring patterns. This backing agent is also applied to the entire area of the reverse of the base film except both the edge portions of the reverse in the same manner as the photoresist by using a roll-coater.

The step (5) in the invention is a step of slitting the wide TAB tape 7 in the longitudinal direction thereof to obtain two separate strips of TAB tape 8 (FIG. 1(g)).

In the manufacturing method according to this invention, the wiring patterns may be screen printed with a solderresist and then plated prior to or after the step (5) described above. The order of printing and plating in this case may be optional, and printing with a solderresist is not necessarily essential.

Figure 1:
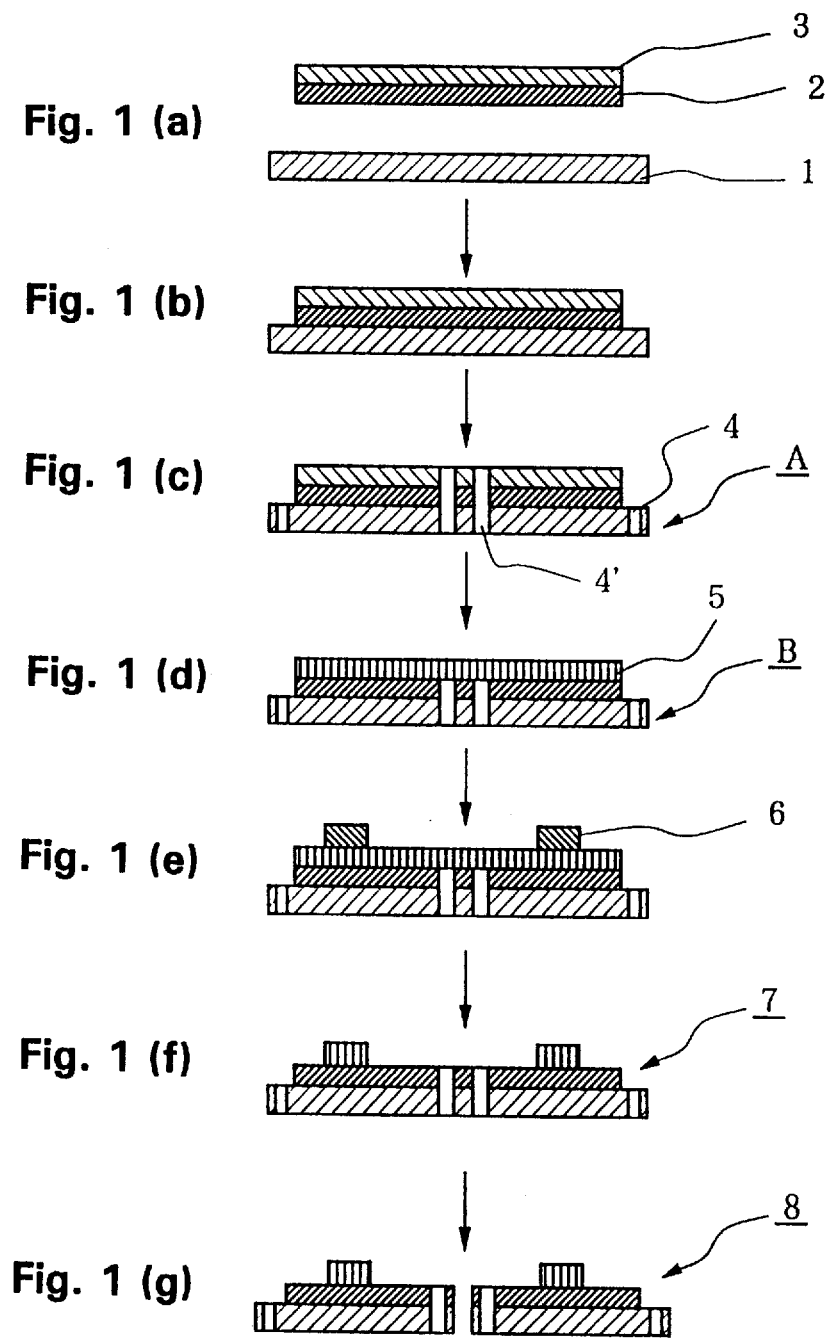
FIG. 1 is a schematic cross sectional view showing the steps of manufacturing two separate strips of TAB tape at the same time according to this invention.
Figure 2:
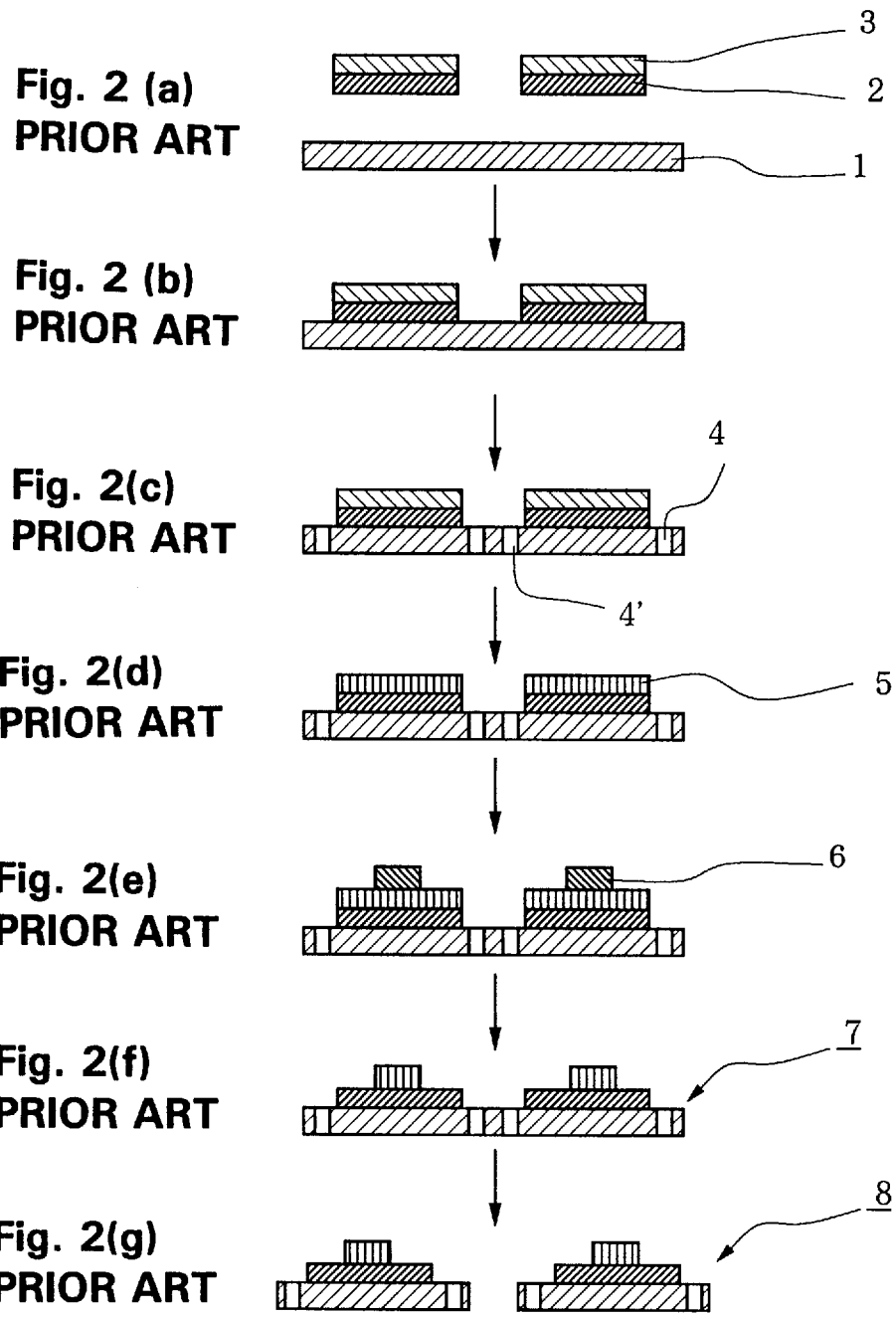
FIG. 2 is a schematic cross sectional view showing the conventional steps of manufacturing two separate strips of TAB tape at the same time.

In the above FIGS. , reference numerals and symbols indicate the following, respectively:

1, base film; 2, adhesive layer; 2', 2", area on which adhesive layer is to be laminated; 3, protection film; 4, 4', sprocket hole; 5, copper foil; 6, photoresist; 7, wide TAB tape; 8, final or desired TAB tape; 9, device hole; 10, edge portion; A, laminated body A; B, laminated body B.

DESCRIPTION OF THE PREFERRED EMBODIMENT

This invention will be better understood by the following Example.

EXAMPLE

Figure 3:
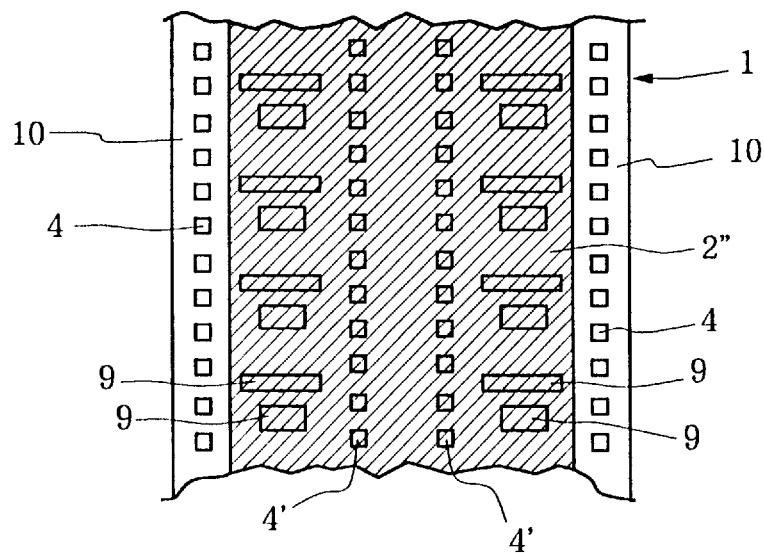
FIG. 3 is a plan view showing an area (indicated by a hatched area) on which an adhesive layer and the like are laminated in a method for manufacturing two separate strips of TAB tape according to this invention.
Figure 4:
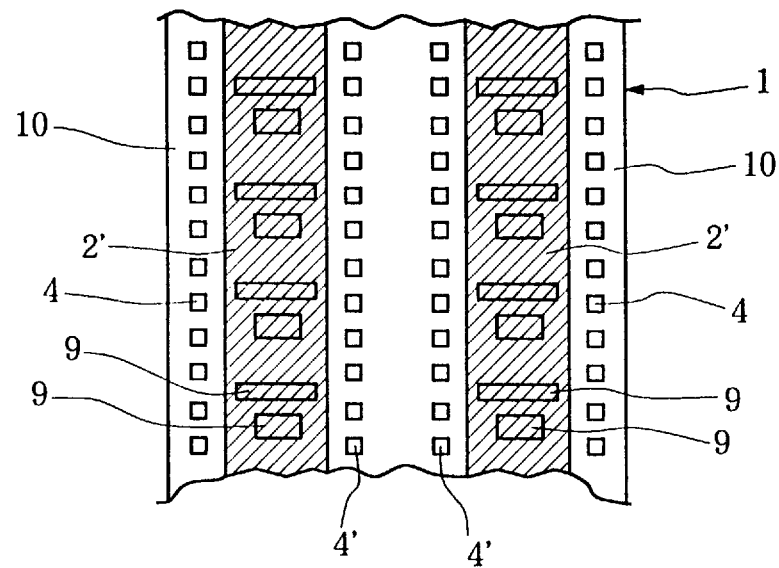
FIG. 4 is a plan view showing areas (indicated by hatched areas) on which an adhesive layer and the like are laminated in a conventional method for manufacturing two separate strips of TAB tape.

A protection film-covered adhesive layer (trade name: E, produced by Tomoegawa Paper Co., Ltd.) was laminated on a polyimide resin-made base film having a width of 70 mm (thickness: 75 µm, trade name: Yeupilex film, produced by UBE Industries, Ltd.) in such a manner that the adhesive layer covered the base film over 61 mm of its width with 4.5 mm thereof kept intact (non-laminated) at each of both the edge portions of the base film and had a thickness of about 20 µm, thereby to obtain a laminate portion. The thus obtained laminate portion was punched by a die to form therein sprocket holes of 1.981 mm×1.981 mm and different-sized device holes respectively of 22 mm×1.5 mm and 12 mm×2.5 mm as shown in FIG. 3 thereby to obtain a laminated body A which can be used as a base for producing two separate strips of TAB tape at the same time as indicated in FIG. 1(g).

The protection film was then peeled off the adhesive layer of the laminated body A, after which an electrolytic copper foil having a width of 61 mm and a thickness of 18 µm was temporarily pressure-applied to the adhesive layer by a laminator and then the adhesive was cured at a temperature of 160° C. to obtain a laminated body B used for producing therefrom two separate strips of TAB tape at the same time.

The laminated body B so obtained was acid-washed (pickled), and a photoresist was then applied to the copper foil. A positive-type liquid resist (trade name: S-2400, produced by Shipley Far East Ltd.) was applied as the photoresist, dried, allowed to stand still for one day, and then exposed by masked with a glass-made photomask with 70 µm-pitch patterns arranged thereon in 2 lines and then irradiated with ultraviolet rays for imaging.

The resist so treated was developed at 25° C. with a 14–16% KOH solution, and a backing agent was successively applied to the reverse surface of the base film with a roll coater while passing the base film (in-line). The backing agent was heated, temporarily dried, and baked while passing the base film (in-line).

Then wiring patterns were formed by etching the photoresist-developed copper foil with a cupric chloride etchant, and the remaining photoresist and the backing agent were peeled off with a NaOH solution. Then a solderresist ink was applied to the wiring patterns (trade name: CCR232GF, produced by Asahi Chemical Research Laboratory Co., Ltd.) by screen-printing. After the solder resist ink was cured at 140° C., the ink-cured wiring patterns were subjected to electroless tin plating at 70° C. for 3 min. so that the thickness of a tin plate formed on the wire patterns reached about 0.45 µm. Electrolytic solder plating, electrolytic gold plating or the like may also be applied.

The thus obtained wide TAB tape having a width of 70 mm for producing therefrom two separate strips of TAB tape was slit with a slitter in the longitudinal direction thereof, so that desired two separate strips of TAB tape each having a width of 35 mm could be manufactured. The all steps described above could be executed using the existing equipments for manufacturing one strip of TAB tape having a width of 70 mm, and no problems were raised as to the dimension, form and appearance of the TAB tapes so obtained.

As described above, the adhesive layer, the copper foil and the like can be laminated on, or adhered to, the base film by use of only one roll-device due to the fact that the adhesive layer, etc. are laminated on or adhered to the entire area of the base film except both the edge portions thereof. Accordingly, the time required for setting the reels of the base film, the protection film-covered adhesive layer, the copper foil and the like on a laminator can be reduced by 10% to 40% as compared with a conventional required time, this making it possible to largely improve the working efficiency.

Further, only one roll-out device is used for laminating and, therefore, it becomes easier than before to laminate the adhesive layer, etc. on the base film. For this reason, not only the dimensional accuracy of TAB tapes, but also that of the adhesive layer, protection film or copper foil of laminated bodies A and B used for producing the TAB tapes, the bodies A and B being intermediate products thereof, can be improved.

Still further, the copper foil covers the sprocket holes 4' in the laminated body B except both the edge portions of the base film, so that there is no possibility that the backing agent trickles around the film and reaches the top surface of the body B on which wiring patterns are to be formed, and for this reason, the backing agent becomes allowed to be applied to the entire area of the reverse of the base film except both the edge portions of the reverse with a roll coater at a time.

According to the manufacturing method of this invention, an adhesive layer and the like are laminated on the to-be-slit central portion of a base film, so that the sag of the central portion thereof is little thereby to dispense with the support of the central portion by rollers or the like. For this reason, when two separate strips of 35 mm-wide TAB tape are to be manufactured according to this invention, an existing equipment (including a slitter) for producing one strip of 70 mm-wide TAB tape can commonly be used for producing said two separate strips of 35 mm-wide TAB tape at the same time whereby another equipment used only for producing such two separate strips of 35 mm-wide TAB tape at the same time is not required, and separate TAB tapes can thus be obtained at a low cost according to this invention.

What is claimed is:

1. A method of simultaneously manufacturing a plurality of TAB tapes with desired widths and having desired elements thereon, comprising the steps of (1) TO (5):

(1) forming a protection film-covered adhesive layer on the entire surface area of at least one face of a base film, except possibly one or both of the edge portions thereof, thereby to obtain a laminated portion, the base film being enough wide to provide a base film for each of said plurality of TAB tapes;

(2) forming sprocket holes in the thus obtained laminated portion comprising the base film and the protection film-covered adhesive layer and in both the edge portions of said base film, and forming device holes in said laminated portion;

(3) removing said protection film from the adhesive layer, and adhering a copper foil to said adhesive layer;

(4) applying a photoresist to said copper foil, exposing and developing the photoresist-applied copper foil and then etching the photoresist-developed copper foil to form patterns thereby to obtain a wide TAB tape in which said plurality of TAB tapes are originally integrally formed with each other in parallel; and (5) slitting said wide TAB tape in the longitudinal direction thereof to obtain said plurality of TAB tapes.

2. A method of manufacturing TAB tapes according to claim 1, wherein, after said step of (4), solderresist ink is deposited on said patterns and then cured, after which said patterns so treated are subjected to plating.

3. A method of manufacturing TAB tapes according to claim 1, wherein, after said step of (5), solderresist ink is deposited on said patterns and then cured, after which said patterns so treated are subjected to plating.

4. A method of manufacturing TAB tapes according to claim 1, wherein, after said step of (4), said patterns are subjected to plating and then screen printed with a solder-resist ink which is thereafter cured.

5. A method of manufacturing TAB tapes according to claim 1, wherein, after said step of (5), said patterns are subjected to plating and then screen printed with a solder-resist ink which is thereafter cured.

6. A method of manufacturing TAB tapes according to claim 1, wherein, after said step of (4), said patterns are subjected to plating.

7. A method of manufacturing TAB tapes according to claim 1, wherein, after said step of (5), said patterns are subjected to plating.

8. A method of manufacturing a plurality of TAB tapes from a base film in a single operation comprising:

forming a structure extending across a substantial portion of said base film;

said structure including at least first and second parallel sets of sprocket holes;

said first parallel set of sprocket holes including a first line of sprocket holes near a first edge of said base film, and a second line of sprocket holes spaced inward in said base film from said first line of sprocket holes;

said second parallel set of sprocket holes including a third line of sprocket holes near a second edge of said base film, and a fourth line of sprocket holes spaced inward in said base film from said third line of sprocket holes;

severing said base film between said second and fourth lines of sprocket holes, whereby said structure is divided into at least first and,second TAB tapes.

* * * * *